(12) United States Patent
Wang et al.

(10) Patent No.: US 11,671,110 B2
(45) Date of Patent: Jun. 6, 2023

(54) METHOD AND APPARATUS FOR NEURAL NETWORK MODEL COMPRESSION/DECOMPRESSION

(71) Applicant: Tencent America LLC, Palo Alto, CA (US)

(72) Inventors: Wei Wang, Palo Alto, CA (US); Wei Jiang, San Jose, CA (US); Shan Liu, San Jose, CA (US)

(73) Assignee: Tencent America LLC, Palo Alto, CA (US)

( * ) Notice: Subject to any disclaimer, the term of this patent is extended or adjusted under 35 U.S.C. 154(b) by 252 days.

(21) Appl. No.: 17/081,642

(22) Filed: Oct. 27, 2020

(65) Prior Publication Data

US 2021/0159912 A1 May 27, 2021

Related U.S. Application Data

(60) Provisional application No. 62/958,697, filed on Jan. 8, 2020, provisional application No. 62/939,057, filed
(Continued)

(51) Int. Cl.
*H03M 7/00* (2006.01)
*H03M 7/30* (2006.01)
(Continued)

(52) U.S. Cl.
CPC ............ *H03M 7/3064* (2013.01); *G06N 3/02* (2013.01); *H03M 7/6005* (2013.01); *H04N 19/11* (2014.11); *H04N 19/13* (2014.11)

(58) Field of Classification Search
CPC .... H03M 7/3064; H03M 7/6005; G06N 3/02; H04N 19/11; H04N 19/13
See application file for complete search history.

(56) References Cited

U.S. PATENT DOCUMENTS

2018/0184123 A1 6/2018 Terada et al.
2019/0246102 A1 8/2019 Cho et al.
(Continued)

FOREIGN PATENT DOCUMENTS

| EP | 3562162 A1 * | 10/2019 | ............... G06N 3/02 |
|---|---|---|---|
| JP | 2016514931 A | 5/2016 | |
| KR | 20170082356 A | 7/2017 | |

OTHER PUBLICATIONS

"Description of Core Experiments on Compression of neural networks for multimedia content description and analysis", International Organization for Standardization Organisation Internationale De Normalisation ISO/IEC JTC1/SC29/WG11 Coding of Moving Pictures and Audio, ISO/IEC JTC1/SC29/WG11/N18782, Geneva, CH, Oct. 11, 2019 (14 pages).
(Continued)

*Primary Examiner* — Joseph J Lauture
(74) *Attorney, Agent, or Firm* — Arentfox Schiff LLP

(57) ABSTRACT

Aspects of the disclosure provide methods and apparatuses for neural network model compression/decompression. In some examples, an apparatus for neural network model decompression includes receiving circuitry and processing circuitry. The processing circuitry decodes, from a bitstream corresponding to a representation of a neural network, at least a syntax element to be applied to multiple blocks in the neural network. Then, the processing circuitry reconstructs, from the bitstream, weight coefficients in the blocks based on the syntax element.

20 Claims, 16 Drawing Sheets

Related U.S. Application Data on Nov. 22, 2019, provisional application No. 62/939,054, filed on Nov. 22, 2019.

(51) Int. Cl.
*G06N 3/02* (2006.01)
*H04N 19/11* (2014.01)
*H04N 19/13* (2014.01)

(56) References Cited

U.S. PATENT DOCUMENTS

2019/0327479 A1  10/2019  Chen et al.
2019/0347550 A1  11/2019  Jung et al.

OTHER PUBLICATIONS

"Working Draft 2 of Compression of neural networks for multimedia content description and analysis", International Organization for Standardization Organisation Internationale De Normalisation ISO/IEC JTC1/SC29/WG11 Coding of Moving Pictures and Audio, ISO/IEC JTC1/SC29/WG11/N18784, Geneva, CH, Oct. 31, 2019 (26 pages).

"Test model 2 of Compression of neural networks for multimedia content description and analysis", International Organization for Standardization Organisation Internationale De Normalisation ISO/IEC JTC1/SC29/WG11 Coding of Moving Pictures and Audio, ISO/IEC JTC1/SC29/WG11/N18785, Geneva, CH, Oct. 31, 2019 (10 pages).

Goto et al.—"Anatomy of High-Performance Matrix Multiplication", ACM Transactions on Mathematical Software, https://www.semanticscholar.org/paper/Anatomy-of-high-performance-matrix-multiplication-Goto-Geijn/334f03c98b61090a9e956d4bfba4a-bdfa1c94b53, May 2008 (25 pages).

Bross et al.—"Versatile Video Coding (Draft 6)", Joint Video Experts Team (JVET) of ITU-T SG 16 WP3 and ISO/IEC JTC 1/SC 29/WG 11, 15$^{th}$ Meeting: Gothenburg, SE, Jul. 3-12, 2019, Document: JVET-O2001vE (456 pages).

Japanese Office Action dated Jan. 4, 2023 in 2021-559625 with English Translation, 13 pages.

Benoit Jacob, et al., Quantization and Training of Neural Networks for Efficient Integer-Arithmetic-Only Inference, 2018 IEEE/CVF Conference on Computer Vision and Pattern Recognition, Dec. 16, 2018, pp. 2704-2713.

Shahab Hamidi-Rad, et al., [NNR] CE3-related: conditional arithmetic coding for quantized parameters, ISO/IEC JTC1/SC29 WG11, MPEG2019/m51018, Sep. 2019, pp. 1-7.

Al-Hami Mo'Taz et al.: "Methodologies of 1,14,15 G06N3/04 Compressing a Stable Performance Convolutional Neural Networks in Image Classification", Neural Processing Letters, Kluwer Academic Publishers, Norwell, MA, US, vol. 51, No. 1, Jul. 20, 2019, pp. 105-127.

Supplemental European Search Report dated Nov. 24, 2022 in 20890921.8, 10 pages.

Supplemental European Search Report dated Dec. 12, 2022 in 20889655.5, 12 pages.

Wei Wang et al: "Huawei's response to the Call for Proposal on Neural Network Compression", 126. MPEG Meeting; Mar. 25, 2019-Mar. 29, 2019; Geneva; (Motion Picture Expert Group or ISO/IEC JTC1/SC29/WG11), No. m47491, Mar. 29, 2019, pp. 1-24.

\* cited by examiner

FIG. 2

```
quant_weight_tensor( dimensions, maxNumNoRem ) {
    dim = Size( dimensions )
    for( i = TensorIterator( dim );!TensorIteratorEnd( i, dimensions ); i = TensorIteratorNext( i, dimensions ) {
        quant_weight( i, maxNumNoRem )
    }
}
```

| | descriptor |
|---|---|
| quant_weight( i, maxNumNoRem ) { | |
|   QuantWeight[i] = 0 | |
|   sig_flag | ae(v) |
|   if( sig_flag ) { | |
|     QuantWeight[i]++ | |
|     sign_flag | ae(v) |
|     j = -1 | |
|     do { | |
|       j++ | |
|       abs_level_greater_x[j] | ae(v) |
|       QuantWeight[i] += abs_level_greater_x[j] | |
|     } while( abs_level_greater_x[j] == 1 && j < maxNumNoRem ) | |
|     if( j == maxNumNoRem ) { | |
|       RemBits = 0 | |
|       j = -1 | |
|       do { | |
|         j++ | |
|         abs_level_greater_x2[j] | ae(v) |
|         if( abs_level_greater_x2[j] ) { | |
|           RemBits++ | |
|           QuantWeight[i] += 1 << RemBits | |
|         } | |
|       } while( abs_level_greater_x2[j] ) | |
|       abs_remainder | uab(RemBits) |
|       QuantWeight[i] += abs_remainder | |
|     } | |
|     QuantWeight[i] = sign_flag ?-QuantWeight[i] : QuantWeight[i] | |
|   } | |
| } | |

*FIG. 4*

```
layer_header() {
  ......
  layer_stepsize          flt(32)
  layer_bitdepth
  ......
}
```

FIG. 5A

```
layer_header() {
  ......
  layer_sat_maxw
  layer_bitdepth
  ......
}
```

FIG. 5B

| | |
|---|---|
| nnr() { | |
| ...... | |
|    layer_header() | |
|    if(enable_max_ctu3d_size){ | |
|       max_ctu3d_height= max_ctu3d_width=int( max_ctu3d_size*max_ctu3d_size/R/S), or | ← 801 |
|       max_ctu3d_height= max_ctu3d_width=(2**(bitdepth(int( max_ctu3d_ size * max_ctu3d_ size /R/S))-1) | ← 802 |
|    } | |
|    if(layer_scan_order==SCAN_CK){ | |
|       for(c=0;c<C;c+=max_ctu3d_height){ | |
|          for(k=0;k<K;k+=max_ctu3d_width){ | |
|             ctu3d_height=min(max_ctu3d_height,C-c); | |
|             ctu3d_width=min(max_ctu3d_width,K-k); | |
|             last_ctu3d_flag=(max_ctu3d_height>=C-c && max_ctu3d_width>=K-k)?1:0 | |
|             ctu3d(c,k,ctu3d_height,ctu3d_width) | |
|             end_of_layer(last_ctu3d_flag) | |
|          } | |
|       } | |
|    }else if(layer_scan_order==SCAN_KC){ | |
|       for(k=0;k<K;k+=max_ctu3d_width){ | |
|          for(c=0;c<C;c+=max_ctu3d_height){ | |
|             ctu3d_height=min(max_ctu3d_height,C-c); | |
|             ctu3d_width=min(max_ctu3d_width,K-k); | |
|             last_ctu3d_flag=(max_ctu3d_height>=C-c && max_ctu3d_width>=K-k)?1:0 | |
|             ctu3d(c,k,ctu3d_height,ctu3d_width) | |
|             end_of_layer(last_ctu3d_flag) | |
|          } | |
|       } | |
|    } | |
|    ...... | |
| } | |

*FIG. 8A*

| |  |
|---|---|
| nnr_header() { | |
| ...... | |
|     enable_max_ctu3d_size | |
|     max_ctu3d_idx | |
| ...... | |
| } | |

FIG. 8B

| |  |
|---|---|
| layer_header() { | |
| ...... | |
|     layer_scan_order | |
| ...... | |
| } | |

FIG. 8C

| |   |
|---|---|
| ctu3d(...) { | |
| ...... | |
|     cu3d(0,0,0) | |
| ...... | |
| } | |

FIG. 10A

| |   |
|---|---|
| cu3d(depth,y_idx,x_idx){ | |
| ...... | |
|     if(cu3d does not exist) | |
|         return | |
|     if(depth<ctu3d_depth-1){ | |
|         split_flag | |
|         if(split_flag){ | |
|             cu3d(depth+1,(y_idx<<1),(x_idx<<1)) | |
|             cu3d(depth+1,(y_idx<<1)+1,(x_idx<<1)) | |
|             cu3d(depth+1,(y_idx<<1),(x_idx<<1)+1) | |
|             cu3d(depth+1,(y_idx<<1)+1,(x_idx<<1)+1) | |
|             return | |
|         } | |
|     } | |
| ...... | |
| } | |

FIG. 10B

| nnr_header() { | |
|---|---|
| nnr_header_size | optional |
| ...... | |
| total_layer | |
| enable_zdep_reorder | |
| enable_max_ctu3d_size | |
| max_ctu3d_idx | |
| max_ndim_bitdepth | |
| max_1dim_bitdepth | |
| ...... | |
| } | |

*FIG. 11*

| layer_header() { | | |
| --- | --- | --- |
| layer_size | | |
| ...... | | |
| total_sublayer | | |
| for(sublayer_idx=0;sublayer_idx<total_sublayer;++sublayer_idx){ | | |
| sublayer_size | | optional |
| sublayer_ndim | | optional |
| sublayer_shape[ndim] | | optional |
| sublayer_scan_order | | |
| sublayer_sat_maxw | | |
| sublayer_delta_bitdepth=0 | | |
| if(sublayer_ndim!=1) | | optional |
| sublayer_delta_bitdepth | | |
| } | | |
| ...... | | |
| } | | |

FIG. 12

```
nnr() {
    ......
    nnr_header()
    for(layer_idx=0; layer_idx<total_layer;++ layer_layer){
        layer_header()
        if(enable_max_ctu3d_size)
            max_ctu3d_height= max_ctu3d_width=(2**(bitdepth(int( max_ctu3d_ size * max_ctu3d_ size /R/S))-1)
        sublayer_idx=0
        do{
            if(sublayer_ndim[sublayer_idx]==1){
                array1d(sublayer_idx)
                ++sublayer_idx
            }else {
                if(sublayer_type[sublayer_idx]=="conv/fc" && sublayer_type[sublayer_idx+1]=="bias")
                    array1d(sublayer_idx+1)
                if(layer_scan_order==SCAN_CK){
                    for(c=0;c<C;c+=max_ctu3d_height){
                        for(k=0;k<K;k+=max_ctu3d_width){
                            ctu3d_height=min(max_ctu3d_height,C-c);
                            ctu3d_width=min(max_ctu3d_width,K-k);
                            last_ctu3d_flag=(max_ctu3d_height>=C-c && max_ctu3d_width>=K-k)?1:0
                            ctu3d(c,k,ctu3d_height,ctu3d_width)
                            end_of_layer(last_ctu3d_flag)
                        }
                    }
                }else if(layer_scan_order==SCAN_KC){
                    for(k=0;k<K;k+=max_ctu3d_width){
                        for(c=0;c<C;c+=max_ctu3d_height){
                            ctu3d_height=min(max_ctu3d_height,C-c);
                            ctu3d_width=min(max_ctu3d_width,K-k);
                            last_ctu3d_flag=(max_ctu3d_height>=C-c && max_ctu3d_width>=K-k)?1:0
                            ctu3d(c,k,ctu3d_height,ctu3d_width)
                            end_of_layer(last_ctu3d_flag)
                        }
                    }
                }
                sublayer_idx+=(sublayer_type[sublayer_idx]=="conv/fc" && sublayer_type[sublayer_idx+1]=="bias")?2:1
        }while(sublayer_idx<total_sublayer)
    }
    ......}
```

*FIG. 13*

METHOD AND APPARATUS FOR NEURAL NETWORK MODEL COMPRESSION/DECOMPRESSION

INCORPORATION BY REFERENCE

This present disclosure claims the benefit of priority to U.S. Provisional Application No. 62/939,057, "QUANTIZATION FOR NEURAL NETWORK MODEL COMPRESSION" filed on Nov. 22, 2019, U.S. Provisional Application No. 62/939,054, "ADAPTIVE BLOCK PARTITION FOR NEURAL NETWORK MODEL COMPRESSION" filed on Nov. 22, 2019, and U.S. Provisional Application No. 62/958,697, "HIGH LEVEL SYNTAX FOR NEURAL NETWORK MODEL COMPRESSION" filed on Jan. 8, 2020. The entire disclosures of the prior applications are hereby incorporated by reference in their entirety.

TECHNICAL FIELD

The present disclosure describes embodiments generally related to neural network model compression/decompression.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Various applications in the fields of computer vision, image recognition, and speech recognition rely on neural networks to achieve performance improvements. A neural network is based on a collection of connected nodes (also referred to as neurons), which loosely model the neurons in a biological brain. The neurons can be organized into multiple layers. Neurons of one layer connect to neurons of the immediately preceding and immediately following layers. A connection between two neurons, like the synapses in a biological brain, can transmit a signal from one neuron to the other neuron. A neuron that receives a signal then processes the signal and can signal other connected neurons. In some examples, to find the output of a neuron, inputs to the neuron are weighted by the weights of the connections from the inputs to the neuron and the weighted inputs are summed to generate a weighted sum. A bias may be added to the weighted sum. Further, the weighted sum is then passed through an activation function to produce the output.

SUMMARY

Aspects of the disclosure provide methods and apparatuses for neural network model compression/decompression. In some examples, an apparatus for neural network model decompression includes receiving circuitry and processing circuitry. The processing circuitry decodes, from a bitstream corresponding to a representation of a neural network, at least a syntax element to be applied to multiple blocks in the neural network. Then, the processing circuitry reconstructs, from the bitstream, weight coefficients in the blocks based on the syntax element.

In some examples, the processing circuitry decodes, from a neural network representation (NNR) header, an index that is indicative of a coding tree unit (CTU) size. Then the processing circuitry partitions a weight tensor into CTUs based on the CTU size that is indicated by the index and reconstruct, from the bitstream, the weigh coefficients of the CTUs.

In some embodiments, the processing circuitry decodes, from a neural network representation (NNR) header, a flag that indicates whether to change a coding tree unit (CTU) size based on a kernel size. Then, the processing circuitry updates the CTU size based on the kernel size in response to an enable of changing the CTU size based on the kernel size that is indicated by the flag, partitions a weight tensor into CTUs based on the updated CTU size, and reconstruct, from the bitstream, the weigh coefficients of the CTUs.

In some examples, the processing circuitry decodes, from the bitstream, one or more split flags indicative of partitions in a CTU, and then partitions the CTU into coding units (CUs) based on the one or more split flags.

In some embodiments, the processing circuitry determines, based on at least the syntax element, a bit depth for quantized weight coefficients in a layer. Then, the processing circuitry allocates, a memory space for the quantized weight coefficients based on the bit depth, and decodes, from the bitstream, the quantized weigh coefficients in the layer using the allocated memory space. In some examples, the processing circuitry decodes, from a neural network representation (NNR) header, a global bit depth, and decodes, from a layer header for the layer, a difference of the bit depth from the global bit depth. Then, the processing circuitry determines the bit depth for quantized weigh coefficients in the layer based on a combination of the global bit depth and the difference of the bit depth from the global bit depth.

In some examples, the processing circuitry decodes, from a layer header, a flag indicative of a scan order of the multiple blocks in a layer, and decodes, the blocks from the bitstream according to the scan order.

In an example, the processing circuitry decodes, from a layer header, at least one of a number of dimensions in a layer, a shape of the layer, a scan order of coding units in the layer, a saturated maximum value in the layer, and a quantization step size in the layer.

In some embodiments, the processing circuitry decodes, from the bitstream, a bias sublayer of a layer before decoding another sublayer of the layer in response to the layer including the bias sublayer and the other sublayer.

In some examples, the processing circuitry decodes, a parameter from a header portion in the bitstream, the parameter being indicative of a total size of the header portion, and access, a portion behind the header portion in the bitstream based on the parameter.

Aspects of the disclosure also provide a non-transitory computer-readable medium storing instructions which when executed by a computer for neural network model decompression cause the computer to perform the method for neural network model decompression.

BRIEF DESCRIPTION OF THE DRAWINGS

Further features, the nature, and various advantages of the disclosed subject matter will be more apparent from the following detailed description and the accompanying drawings in which:

FIG. 2 shows an example for performing quantization of a weight tensor.

FIG. 4 shows an example for decoding the absolute value of quantized weight coefficient according to some embodiments of the disclosure.

FIGS. 5A-5B show examples of syntax tables according to some embodiments of the disclosure.

FIGS. 8A-8C show syntax examples according to some embodiments of the disclosure.

FIG. 10A and FIG. 10B show exemplary syntax tables for partition according to some embodiments of the disclosure.

FIG. 11 shows an exemplary syntax table according to an embodiment of the disclosure.

FIG. 12 shows another exemplary syntax table according to an embodiment of the disclosure.

FIG. 13 shows an exemplary syntax according to an embodiment of the disclosure.

DETAILED DESCRIPTION OF EMBODIMENTS

Aspects of the disclosure provide various techniques for neural network model compression/decompression. The techniques include quantization techniques, partition techniques, and syntax elements in neural network model compression/decompression.

Artificial neural networks can be adopted for a broad range of tasks in multimedia analysis and processing, media coding, data analytics and many other fields. Success of using artificial neural networks is based on the feasibility of processing much larger and complex neural networks (deep neural networks, DNNs) than in the past, and the availability of large-scale training data sets. As a consequence, trained neural networks can contain a large number of parameters and weights, resulting in a quite large size (e.g., several hundred MBs). Many applications require the deployment of a particular trained network instance, potentially to a larger number of devices, which may have limitations in terms of processing power and memory (e.g., mobile devices or smart cameras), and also in terms of communication bandwidth.

Figure 1:
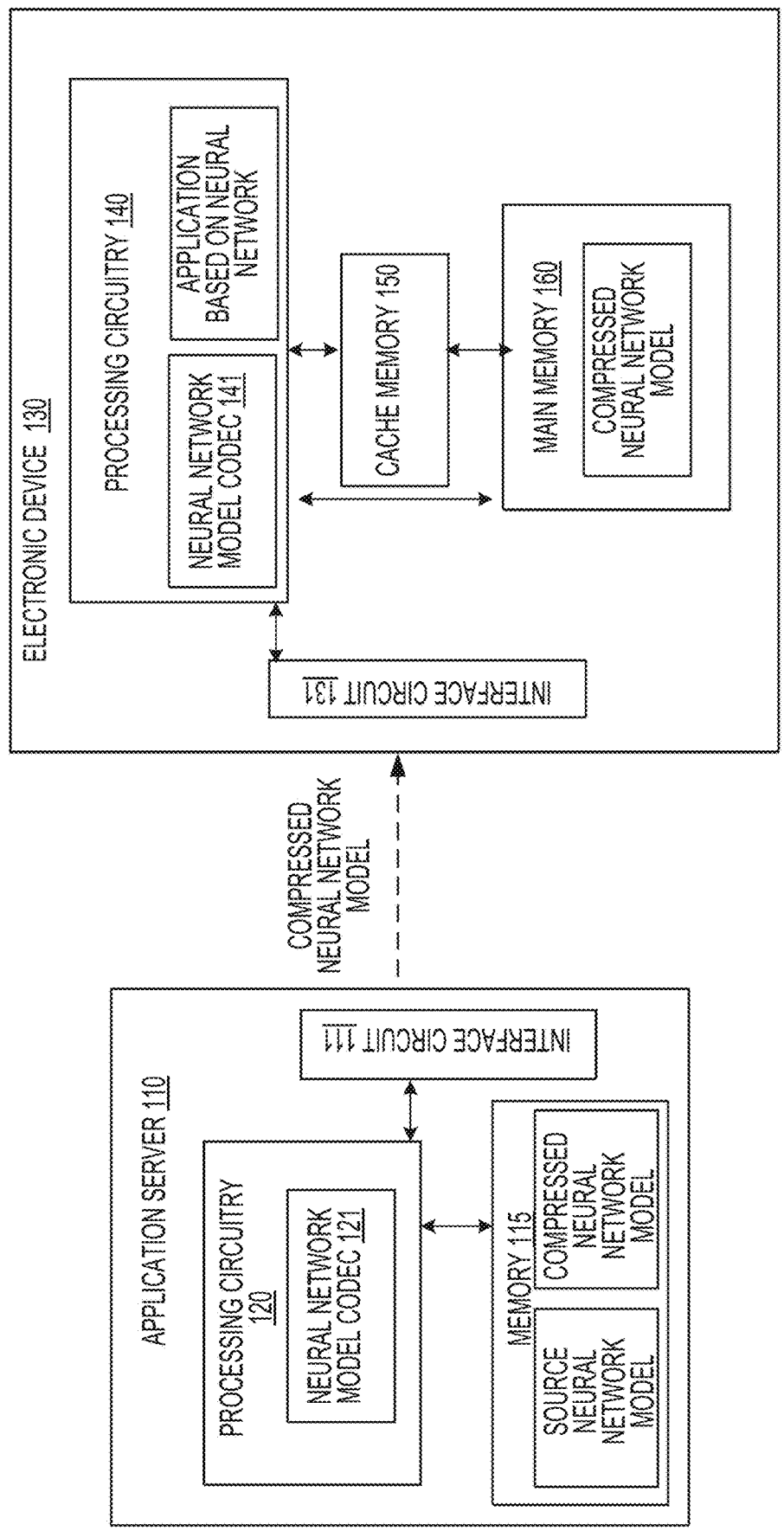
FIG. 1 shows a block diagram of an electronic device 130 according to an embodiment of the disclosure.

FIG. 1 shows a block diagram of an electronic device 130 according to an embodiment of the disclosure. The electronic device 130 is configured to perform applications based on neural networks. In some embodiments, the electronic device 130 stores a compressed neural network model that is also referred to as a representation of a neural network. The electronic device 130 can decompress the compressed neural network model to restore the neural network model, and can perform an application that is based on the neural network model.

In some embodiments, the compressed neural network model is provided from a server, such as an application server 110. The electronic device 130 can decompress the compressed neural network model to restore the neural network model, and can perform an application that is based on the neural network model.

In the FIG. 1 example, the application server 110 includes processing circuitry 120, a memory 115 and interface circuitry 111 coupled together. In some examples, a neural network is suitably generated, trained or updated. The neural network can be stored in the memory 115 as a source neural network model. The processing circuitry 120 includes a neural network model codec 121. The neural network model codec 121 includes an encoder that can compress the source neural network model and generate compressed neural network model that is a representation of the neural network. In some examples, the compressed neural network model is in the form of a bitstream. The compressed neural network model can be stored in the memory 115. The application server 110 can provide the compressed neural network model to other devices, such as the electronic device 130, via the interface circuit 111 in the form of a bitstream.

It is noted that the electronic device 130 can be any suitable device, such as a smart phone, a camera, a tablet computer, a laptop computer, a desktop computer, a gaming headset, and the like.

In the FIG. 1 example, the electronic device 130 includes processing circuitry 140, cache memory 150, main memory 160 and interface circuit 131 coupled together. In some examples, the compressed neural network model is received by the electronic device 130 via the interface circuit 131, for example in the form of a bitstream. The compressed neural network model is stored in the main memory 160.

The processing circuitry 140 includes any suitable processing hardware, such as central processing units (CPUs), graphics processing units (CPUs), and the like. The processing circuitry 140 includes suitable component to execute application based on neural network, and includes suitable component configured as a neural network model codec 141. The neural network model codec 141 includes a decoder that can decode the compressed neural network model. In an example, the processing circuitry 140 includes a single chip with one or more processors disposed on the single chip. In another example, the processing circuitry 140 includes multiple chips, and each chip can include one or more processors.

In some embodiments, the main memory 160 has a relatively large storage space, and can store various information, such as software codes, media data (e.g., video, audio, image, etc.), compressed neural network models, and the like. The cache memory 150 has relatively small storage space, but much faster access speed compared to the main memory 160. In some examples, the main memory 160 can include hard disc drives, solid state drives and the like, and the cache memory 150 can include static random access memory (SRAM), and the like. In an example, the cache memory 150 can be on chip memory that is disposed on, for example, a processor chip. In another example, the cache memory 150 can be off chip memory that is disposed on one or more memory chips that are separate from the processor chips. Generally, on chip memory has faster access speed than off chip memory.

In some embodiments, when the processing circuitry 140 executes an application that uses a neural network model, the neural network model codec 141 can decompress the compressed neural network model to restore the neural network model. In some examples, the cache memory 150 is large enough, thus the restored neural network model can be buffered in the cache memory 150. Then, the processing circuitry 140 can access the cache memory 150 to use the restored neural network model in the application. In another example, the cache memory 150 has limited memory space (e.g., on chip memory), the compressed neural network model can be decompressed layer by layer, or block by block, and the cache memory 150 can buffer the restored neural network model layer by layer or block by block.

It is noted that the neural network model codec 121 and the neural network model codec 141 can be implemented by any suitable techniques. In some embodiments, encoder and/or decoder can be implemented by integrated circuits. In some embodiments, encoder and decoder can be implemented as one or more processors executing a program that is stored in a non-transitory computer-readable medium. The neural network model codec 121 and the neural network model codec 141 can be implemented according to the encoding and decoding features described below.

Video coding technology for visual analysis and understanding can be standardized. In an example, a compact descriptors for visual search (CDVS) standard can include techniques that extract feature representations for image similarity matching from still-images. In another example, compact descriptors for visual analysis (CDVS) standard can include techniques that extract global and local, hand-designed and DNN-based, feature descriptors for video segments.

The present disclosure provides techniques for neural network representation (NNR) that can be used to encode and decode neural network models, such as deep neural network (DNN) models, to save both storage and computation. Deep Neural Network (DNN) can be used in a large range of video applications, such as semantic classification, target detection/recognition, target tracking, video quality enhancement, and the like.

A (artificial) neural network generally includes multiple layers between the input layer and the output layer. In some examples, a layer in the neural network corresponds to the mathematical manipulation to turn the inputs of the layer into the outputs of the layer. The mathematical manipulation can be a linear relationship or a non-linear relationship. The neural network can move through the layers calculating the probability of each output. Each mathematical manipulation as such is considered a layer, and complex DNN can have many layers. In some examples, a mathematical manipulation of a layer can be represented by a weight tensor with weight coefficients and biases.

Various techniques, such as scan order techniques, quantization techniques, entropy coding techniques, and the like can be used in the encoding/decoding of neural network models.

In some examples of the scan order techniques, the dimension of a weight tensor is more than two (such as four in the convolution layer) and the weight tensor can be reshaped to two-dimension tensor. No reshape is performed if the dimension of a weight tensor is no more than two (such as fully connected layer or bias layer) in an example.

To encode the weight tensor, weight coefficients in the weight tensor are scanned according to certain order. In some examples, the weight coefficients in the weight tensor can be scanned in a row-first manner from the left to the right for each row and from the top row to the bottom row for the rows.

FIG. 2 shows a syntax example to scan weight coefficients and perform quantization of a weight tensor.

In some related examples, when the dimension of the weight tensor is more than two, the weight tensor is reshaped to 2-dimension weight tensor. The weight coefficients in the 2-dimension weight tensor can be scanned in a row-first manner from the left to the right for each row and from the top row to the bottom row for the rows.

To quantize weight coefficients, in some examples, fixed step size quantization can be applied. In some examples, the distribution of weight coefficients in a layer of a neural network follows Gaussian distribution, the percentage of weight coefficients with large value is very small, but the maximum value of the weight coefficients can be very big. In some embodiments, an encoder can determine a bit depth (denoted as bitdepth) for the quantized weight coefficients in a layer. The bit depth is the number of bits used to represent the absolute value of the quantized weight coefficients, such as 7-bit. Then, the encoder can use an optimization algorithm, such as based on Kullback-Leibler divergence measure, to determine an optimal saturated max value for the bit depth. When a weight coefficient is out of a range defined based on the saturated max value, the weight coefficient is clipped to the saturated max value. Then, the weight coefficients of the layer can be quantized uniformly to integers in the range of $[-(2^{bitdepth}-1), 2^{bitdepth}-1]$. For example, nearest neighbor (integer) quantization can be applied in a uniform way to each weight coefficient. Specifically, a weight coefficient is quantized to a nearest integer number in the range. The nearest integer number (also referred to as quantized weight coefficient, quantized weight level, and the like) can be suitably coded.

Figure 3:
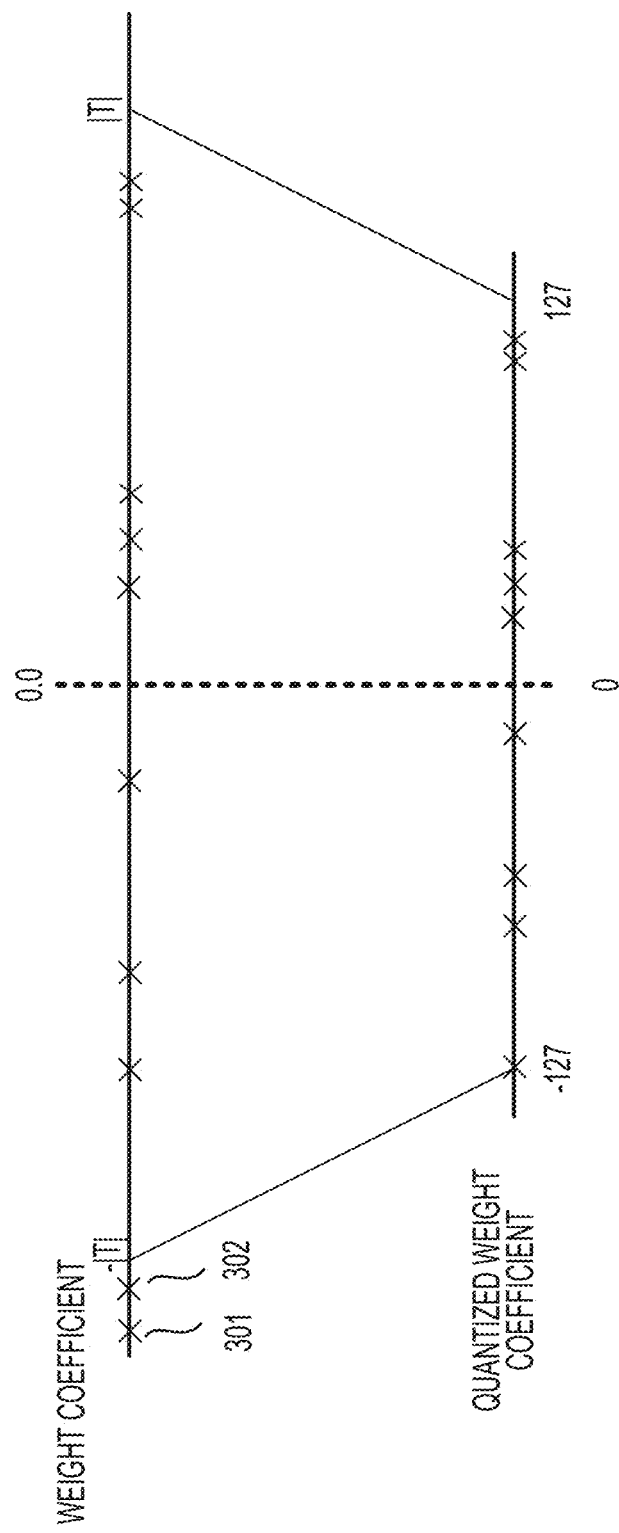
FIG. 3 shows an example of clipping and mapping coefficients to 8-bit representation according to some embodiments of the disclosure.

FIG. 3 shows an example of clipping and mapping coefficients to 7-bit absolute value representation according to some embodiments of the disclosure. In some examples, the encoder determines to use a total of 8-bit representation for the quantized weight coefficients, thus 7 bits can be used for the absolute values of the quantized weight coefficients, and the bit depth is 7. Then, the encoder determines an optimal saturated max value T (also denoted as layer_sat_maxw) based on the optimization algorithm. When a weight coefficient is out of the range of $[-|T|, |T|]$, the weight coefficient is clipped to $-|T|$ or $|T|$ depending on which one is closer. For example, two weight coefficients (301) and (302) are out of the range of $[-|T|, |T|]$, and closer to $-|T|$, thus two weight coefficients (301) and (302) are clipped to $-|T|$. Then, the weight coefficients are quantized uniformly to integers in the range of $[-127, 127]$. For example, the two weight coefficients (301) and (302) are quantized to $-127$.

In an embodiment, the saturated max value T can be represented by 32-bit floating number, and encoder can include the saturated max value T in the bitstream, such as in the layer header. In another embodiment, the saturated max value T can be transformed to integer number while maintaining N bit fractional accuracy. For example, the integer number (int_layer_sat_maxw) for the saturated max value T can be calculated by int_layer_sat_maxw=int(ceil(layer_sat_maxw×$(2^N)$)). In an example, the encoder includes the int_layer_sat_maxw in the bitstream, such as in the layer header; and the decoder can reconstruct the saturated max value (rec_layer_sat_maxw), for example using rec_layer_sat_maxw=(float) int_layer_sat_maxw/$(2^N)$.

In another embodiment, a step size (denoted by stepsize) is suitably determined and is included in the bitstream instead of the saturated max value. For example, the step size is calculated stepsize=layer_sat_maxw/$(2^{bitdepth}-1)$. In an example, the step size is defined as a 32-bit floating number and coded in the bitstream. Thus, when the decoder decodes, from the bitstream, the step size, and an integer number corresponding to a weight coefficient, the decoder can reconstruct the weight coefficient as a multiplication of the integer number and the step size.

To encode the quantized weight coefficients, entropy coding techniques can be used. In some embodiments, an absolute value of the quantized weight coefficient is coded in a sequence that includes a unary sequence that may be followed by a fixed length sequence.

In some examples, the distribution of the weight coefficients in a layer generally follows Gaussian distribution, and the percentage of weight coefficients with large value is very small, but the maximum value of the weight coefficients can be very large. In some embodiments, very smaller values can be coded using unary coding, and the larger values can be coded based on Golomb coding. For example, an integer parameter that is referred to as maxNumNoRem is used to indicate the maximum number when Golomb coding is not used. When a quantized weight coefficient is not greater than (e.g., is equal or smaller than) maxNumNoRem, the quantized weight coefficient can be coded by the unary coding. When the quantized weight coefficient is greater than maxNumNoRem, a portion of the quantized weigh coefficient equal to maxNumNoRem is coded by unary coding, and the reminder of the quantized weight coefficient is coded by Golomb coding. Thus, the unary sequence includes a first portion of the unary coding, and a second portion of bits for coding the exponential Golomb remainder bits.

In some embodiments, a quantized weight coefficient can be coded by the following two steps.

In a first step, a binary syntax element sig_flag is encoded for the quantized weight coefficient. The binary syntax element sig_flag specifies whether the quantized weight coefficient is equal to zero. If the sig_flag is equal to one (indicates that the quantized weight coefficient is not equal to zero), a binary syntax element sign_flag is further encoded. The binary syntax element sign_flag indicates whether the quantized weight coefficient is positive or negative.

In the second step, the absolute value of the quantized weight coefficient can be coded into a sequence that includes a unary sequence that may be followed by a fixed length sequence. When the absolute value of the quantized weight coefficient is equal to or smaller than maxNumNoRem, the sequence includes unary coding of the absolute value of the quantized weight coefficient. When the absolute value of the quantized weight coefficient is greater than maxNumNoRem, the unary sequence can include a first part for coding maxNumNoRem using unary coding, and a second part for coding the exponential Golomb remainder bits, and the fixed length sequence is for coding a fixed length remainder.

In some examples, a unary coding is applied first. For example, a variable, such as j, is initialized with 0, and another variable X is set to j+1. A syntax element abs_level_greater_X is encoded. In an example, when the absolute value of the quantized weight level is greater than the variable X, abs_level_greater_X is set to 1, the unary encoding continues; otherwise, abs_level_greater_X is set to 0, and unary encoding is done. When abs_level_greater_X is equal to 1, and the variable j is smaller than maxNumNoRem, the variable j is increased by 1 and the variable X is also increased by 1. Then, a further syntax element abs_level_greater_X is encoded. The process continues until abs_level_greater_X is equal to 0 or the variable j is equal to maxNumNoRem. When the variable j is equal to maxNumNoRem, the encoded bits are the first part of the unary sequence.

When abs_level_greater_X is equal to 1 and j is equal to maxNumNoRem, the coding continues with Golomb coding. Specifically, the variable j is reset to 0, and X is set to $1<<j$. A unary coding reminder can be calculated as the absolute value of the absolute value of the quantized weight coefficient subtracting maxNumNoRem. A syntax element abs_level_greater_than X is encoded. In an example, when the unary coding reminder is greater than the variable X, abs_level_greater_X is set to 1; otherwise, abs_level_greater_X is set to 0. If the abs_level_greater_X is equal to 1, the variable j is increased by 1, and $1<<j$ is added to X and a further abs_level_greater_X is encoded. The procedure is continued until an abs_level_greater_X is equal to 0, thus the second part of the unary sequence is encoded. When an abs_level_greater_X is equal to 0, the unary coding reminder can be one of the values (X, X−1, . . . X−(1<<j)+1). A code of length j can be used to code an index which points to one value in (X, X−1, . . . X−(1<<j)+1), the code can be referred to as a fixed length remainder.

FIG. 4 shows an example for decoding the absolute value of quantized weight coefficient according to some embodiments of the disclosure. In the FIG. 4 example, QuantWeight[i] denotes the quantized weight coefficient at the ith position in an array; sig_flag specifies whether the quantized weight coefficient QuantWeight[i] is nonzero (e.g., sig_flag being 0 indicates that QuantWeight[i] is zero); sign flag specifies whether the quantized weight coefficient QuantWeight[i] is positive or negative (e.g., sign_flag being 1 indicates that QuantWeight[i] is negative); abs_level_greater_x[j] indicates whether the absolute level of QuantWeight[i] is greater j+1 (e.g., first part of the unary sequence); abs_level_greater_x2[j] comprises the unary part of the exponential golomb remainder (e.g., second part of the unary sequence); and abs_remainder indicates a fixed length remainder.

According to an aspect of the disclosure, a context modeling approach can be used in the coding of the three flags sig_flag, sign_flag, and abs_level_greater_X. Thus, flags with similar statistical behavior can be associated with the same context model, so that the probability estimator (inside of the context model) can adapt to the underlying statistics.

In an example, the context modeling approach uses three context models for the sig_flag, depending on whether the neighboring quantized weight coefficient to the left is zero, smaller, or larger than zero.

In another example, the context model approach uses three other context models for the sign_flag, depending on whether the neighboring quantized weight coefficient to the left is zero, smaller, or larger than zero.

In another example, for each of the abs_level_greater_X flags, the context modeling approach uses either one or two separate context models. In an example, when X<=maxNumNoRem, two context models are used depending on the sign_flag. When X>maxNumNoRem, only one context model is used in an example.

Some aspects of the disclosure provide further techniques for quantization. In some examples, step size is defined as a 32-bit floating number and the decoder doesn't have information of the maximum bit depth of quantized weight coefficients in a layer before the decoding of the quantized weight coefficients of the layer is completed. In some examples, the decoder may need to allocate memory for quantized weight coefficients with the maximum possible bit depth, such as 32-bit, memory usage may be wasted when the maximum bit depth of the layer is much smaller than 32-bits, and the speed of inference operations may be reduced.

Aspects of the disclosure provide techniques to provide bit depth information in the bitstream. Thus, the decoder is aware of the bit depth information before the decoding of the quantized weight coefficients of the layer is finished. The decoder can allocate memory space to store the quantized weight coefficients based on the bit depth information. Thus, memory space can be more efficiently used.

In an embodiment, the bit depth of quantized weight coefficients is included in the layer header. Bit depth can be coded using either variable length coding or fix length coding.

FIG. 5A shows an example of a syntax table (510) in the layer header according to an embodiment of the disclosure. The syntax table (510) includes step size (layer_stepsize) and bit depth (layer_bitdepth) in a layer that are used for quantization and de-quantization of the weight coefficients in the layer. In some examples, based on the bit depth, the decoder can allocate memory space for storing the decoded quantized weight coefficients. Further, after the quantized weight coefficients are decoded, the decoder can reconstruct weight coefficients based on the step size and the quantized weight coefficients, such as multiplications of the step size and the quantized weight coefficients.

In another embodiment, the bit depth of quantized weight coefficient and the saturated max value can be included in the layer header.

FIG. 5B shows another example of a syntax table (520) in the layer header according to an embodiment of the disclosure. The syntax table (520) includes bit depth (layer_bitdepth) and saturated max value (layer_sat_maxw) of a layer that can be used for quantization and de-quantization of the weight coefficients in the layer. In some examples, based on the bit depth, the decoder can allocate memory space for storing the decoded quantized weight coefficients. Further, based on the bit depth and the saturated max value, the decoder can determine step size. Then, after the quantized weight coefficients are decoded, the decoder can reconstruct weight coefficients based on the step size and the quantized weight coefficients, such as multiplications of the step size and the quantized weight coefficients.

It is noted that saturated max value can be represented as floating number or integer number. If the saturated max value is represented as integer, the saturated max value can be coded using either variable length coding or fix length coding method.

According to some aspects of the disclosure, on-chip memory can have relatively high access speed compared to off-chip memory and the on-chip memory is preferred for using in matrix multiplications. However, on-chip memory is relatively small. In some embodiments, block matrix multiplication can be used. Matrix can be partitioned into blocks for block based multiplications. In some examples, for a multiplication of two blocks, when enough space in the on-chip memory is allocated for caching the two blocks and the result, the multiplication of the two blocks can be performed based on accessing to the on-chip memory. Aspects of the disclosure provide techniques to partition a weight tensor into blocks and provide partition information in the bitstream. Thus, the decoder can determine the partition information from the bitstream and decode weight coefficients by blocks.

For example, inference operation for deep learning system uses matrix multiplication intensively. In some embodiments, matrix multiplication can be performed using general matrix multiply (GEMM) Library. The GEMM library includes various routines for partitioning matrixes and performing partitioned matrix multiplication. In some examples, depending on the size of left-hand-side (lhs) matrix and right-hand-side (rhs) matrix in the matric multiplication, two GEMM routines (GEPP/GEBP, GEPM/GEBP) can be used.

Figure 6:
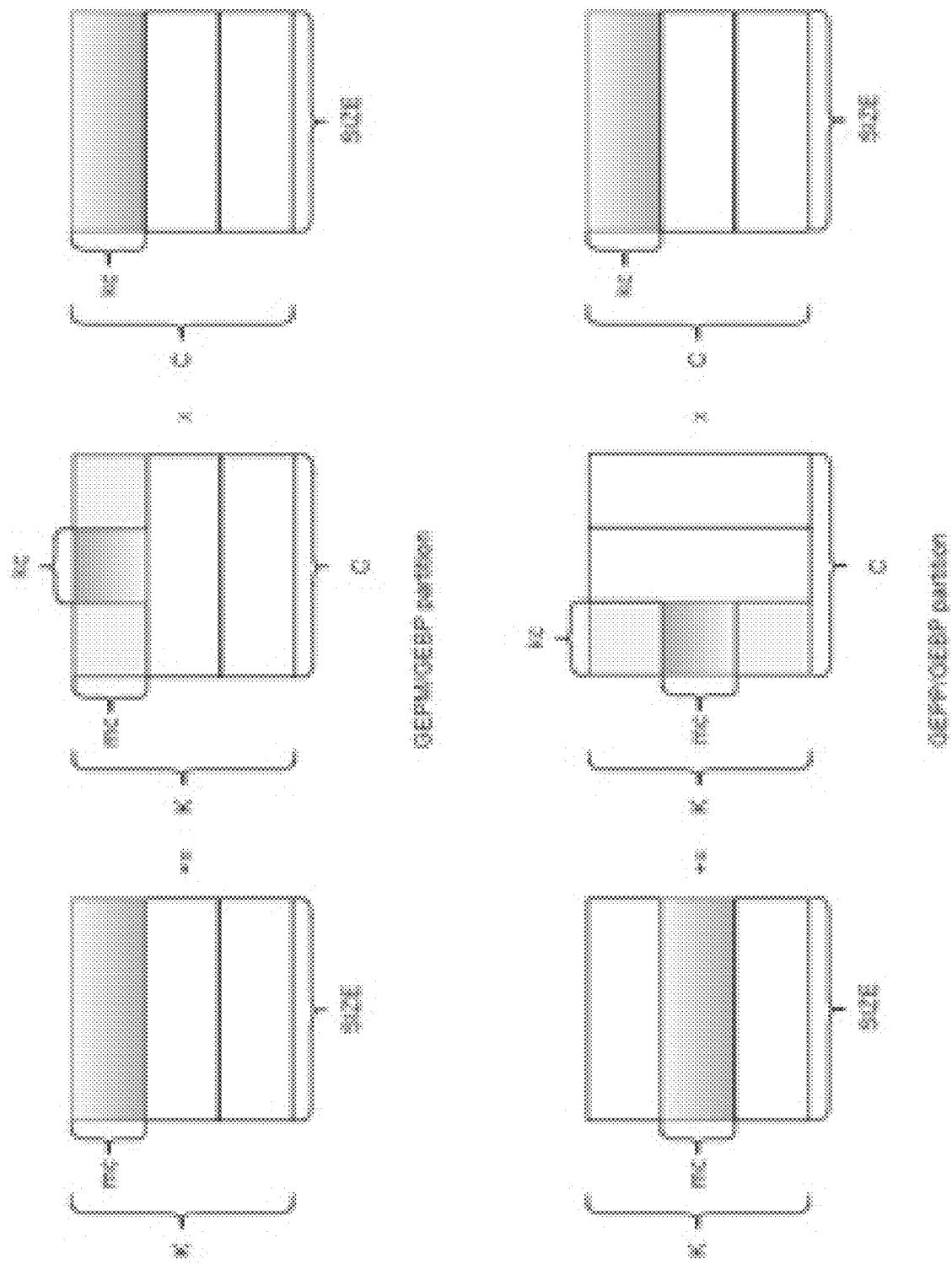
FIG. 6 shows a diagram illustrating routines in a matrix multiplication library.

FIG. 6 shows a diagram illustrating GEPP/GEBP routine and GEPM/GEBP routine. Both GEMM routines partition lhs matrix and rhs matrix recursively to make the best use of different characteristics of off-chip memory (such as DDR) and on-chip memory (such as multi-level cache) in modern computing platform. In some examples, the lhs matrix is preferred to be stored in column-major order in order to achieve optimal memory access pattern.

In some related examples, matrix scan order is defined as row-first manner from the left to the right and the rows from the top to the bottom. This scan order does not match with the preferred memory access pattern required by inference operation, thus for inference operation, weight coefficients are excessively buffered excessive before the inference operation starts. For example, when inference operation is performed for a fully-connected layer, given that the matrix size of the fully connected layer is 25088×4096, a buffer that can store N×25088 weight coefficients has to be reserved in order to perform GEMM routine. If N=64 for normal GEMM operation, the buffer size will be 1.5 MB even if the coefficients are represented by 8-bit integer instead of 32-bit floating number, such buffer size is too high especially for mobile and edge devices.

According to some aspects of the disclosure, the lhs tensor (e.g., the weight tensor) can be partitioned into 3D coding tree units (CTU3Ds, or in short CTUs). Each CTU3D can be partitioned into 3D coding units (CU3Ds, or in short CUs). The scan order of the CTU3Ds is referred to as CTU3D scan order, the scan order of the CU3Ds in a CTU3D is referred to as CU3D scan order, and scan order of weight coefficients in a CU3D is referred to as within CU3D scan order. In some examples, information regarding the partitions and scan order can be included in headers of various levels, such as NNR header, layer header and the like. It is also noted that information regarding the partitions and scan order can be predefined or inferred in some examples. It is noted that, the term 'block' in the present disclosure can be interpreted as a CTU3D, or a CU3D and the like.

In some embodiments, a weight tensor can include more than two dimensions. For example, the lhs tensor includes weight coefficients that can be stored in column-major order. In another example, the lhs tensor is stored in the form of a row-major tensor, and the lhs tensor can be obtained by a transpose of the row-major tensor. In some examples, the dimension of weight tensor can be 4 for convolution layer (sublayer in some examples) with a layout of [R][S][C][K], can be 2 for fully-connected layer (sublayer in some examples) with a layout of [C][K], and can be 1 for bias layer (sublayer in some examples) and batch normalization layer (sublayer in some examples). R and S denote to convolution kernel size, C is input feature size and K is output feature size.

In the examples of a convolution layer, the two-dimension kernel 2D [R][S] can be reshaped to one-dimension kernel 1D [RS] (the size of the one dimension is equal to R×S), thus the 4-dimension tensor 4D [R][S][C][K] can be reshaped to 3-dimension tensor 3D [RS][C][K]. The fully-connected layer can be treated as a special case of 3-dimension tensor with R=S=1.

Generally, the kernel size RS is usually much smaller than input feature size C and the output feature size K. According to an aspect of the disclosure, 3D tensor [RS][C][K] can be partitioned along [C][K] plane into non-overlapping smaller blocks that are referred to as 3D coding tree units (CTU3Ds). Each CTU3D has a shape of [RS][ctu3d_height][ctu3d_width]. In some examples, max_ctu3d_height denotes normal height for CTU, and max_ctu3d_width denotes normal width for CTU3D. In an example, max_ctu3d_height/max_ctu3d_width can be encoded in the bitstream, such as NNR header. Thus, for normal CTU3D [RS][ctu3d_height][ctu3d_width], ctu3d_height is equal to max_ctu3d_height and ctu3d_width is equal to max_ctu3d_width. It is noted that CTU3Ds located at the right and/or bottom of a tensor can have smaller size. For example, the height of a CTU3D at the bottom of a tensor ctu3d_height can be the remainder of C/max_ctu3d_height and the width of a CTU3D at the right of a tensor ctu3d_width can be the remainder of K/max_ctu3d_width.

Figure 7:
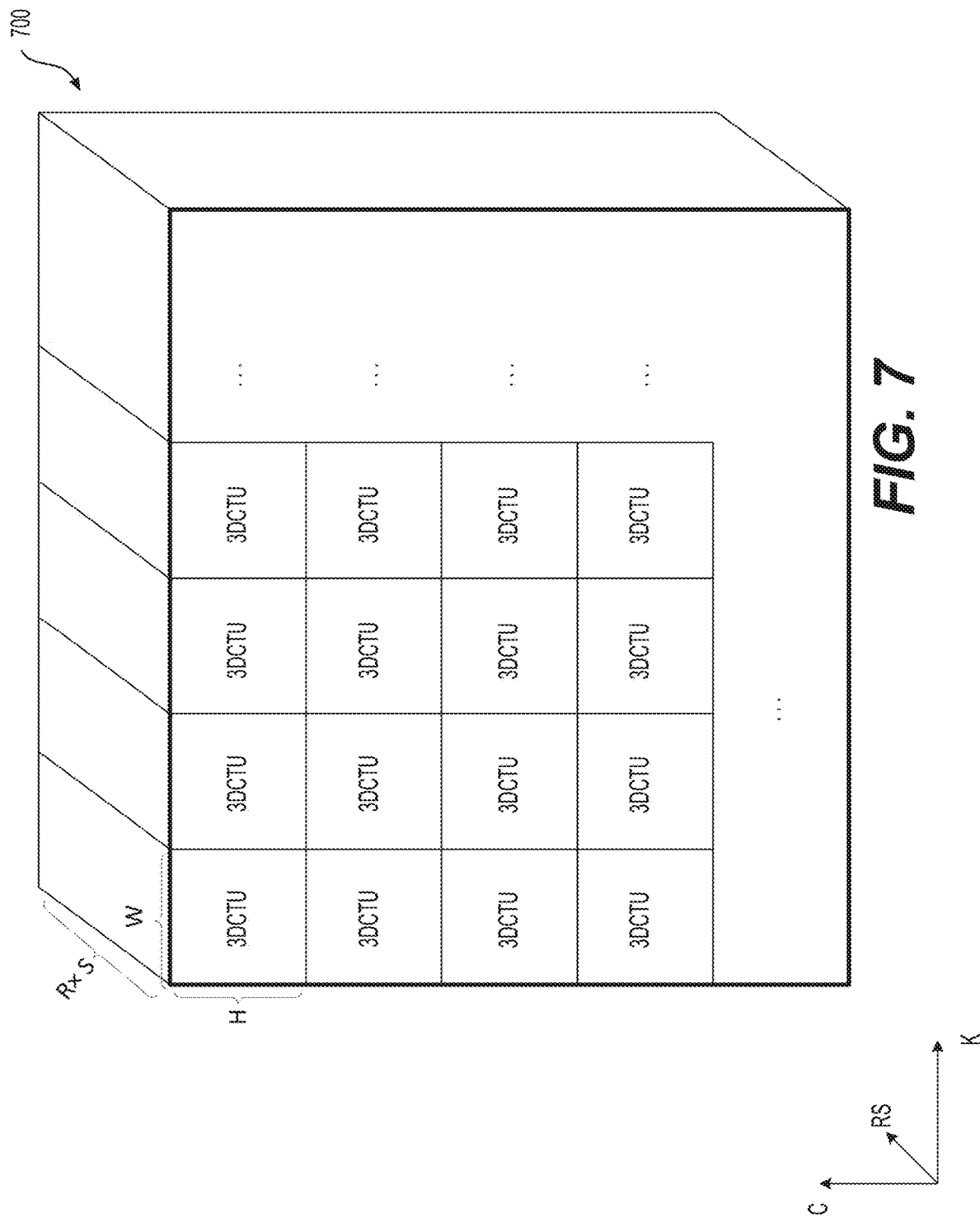
FIG. 7 shows a diagram illustrating tensor partition according to some embodiment of the disclosure.

FIG. 7 shows a diagram illustrating tensor partition according to some embodiment of the disclosure. The tensor (700) is partitioned along [C][K] plane into CTU3Ds. A normal CTU3D has a shape of [RS][H][W], H denotes the height of the CTU3D (ctu3d_height), and W denotes the width of the CTU3D (ctu3d_width).

In some embodiments, 3D tensor [RS][C][K] can be partitioned into CTU3Ds that have a square shape in the [C][K] plane. In such embodiments, max_ctu3d_height is equal to max_ctu3d_width. In some examples, a variable max_ctu3d_size is used to represent both max_ctu3d_height and max_ctu3d_width. In some examples, max_ctu3d_size is defined as 2**N (2 to the power N, $2^N$) and N can be 8, 16, 32, 64 and the like. In an example, max_ctu3d_size information can be encoded in the bitstream, such as NNR header.

In some examples, in order to facilitate the on-chip memory requirement in inference operation, a flag is used to indicate that whether CTU3D size for layers need to be limited with different kernel size. For example, when the flag is equal to 0, ctu3d_height/ctu3d_width can be kept unchanged regardless of the kernel size. In this case, the size of CTU3D for convolution layer is RS (R×S) times bigger than the size of CTU3D for fully-connected layer. In another example, when the flag is equal to 1, ctu3d_height/ctu3d_width can be scaled based on the kernel size. For example, the width and height product of CTU3D is scaled down by R×S.

It is noted that CTU3Ds in a tensor can be scanned by any suitable CTU3D scan order. In some examples, CTU3Ds in a tensor can be scanned by raster scan order in horizontal direction (SCAN_CK). In some examples, CTU3Ds in a tensor can be scanned by raster scan order in vertical direction (SCAN_KC). In some embodiments the CTU3D scan order information can be included in a header, such as layer header and the like.

FIGS. 8A-8C show syntax examples according to some embodiments of the disclosure. FIG. 8A shows a syntax table example for NNR. FIG. 8B shows a syntax table example for NNR header. FIG. 8C shows a syntax table example for a layer header.

In the NNR header, enable_max_ctu3d_size is used to indicate whether to change CTU3D size based on kernel size. In an example, when enable_max_ctu3d_size is 0, CTU3D size parameters, such as ctu3d_height, ctu3d_width and the like are kept unchanged regardless of the kernel size. When enable_max_ctu3d_size is 1, CTU3D size parameters, such as ctu3d_height, ctu3d_width and the like are scaled based on the kernel size, such as shown by (801) and (802) in FIG. 8A.

In the layer header, layer scan order is used to indicate CTU3D scan order. In an example, when layer_scan_order is equal to 0, raster scan order at horizontal direction can be used; and when layer_scan_order is equal to 1, raster scan order at vertical direction can be used.

According to an aspect of the disclosure, each of the CTU3Ds can be further partitioned, for example, along the [C][K] plane, into CU3Ds. In some embodiments, adaptive partition can be used to partition a CTU3D into CU3Ds.

In some embodiments, quad-tree splits can be recursively used. Each quad-tree split can partition a larger block into four smaller blocks of the same shape as the larger block. The larger block can be referred to as a parent node in a split tree structure, and the four smaller blocks can be referred to as child nodes for the parent node. In some examples, CTU3D/CU3D can be split based on quad-tree splits recursively until the maximum recursive depth is reached. Starting from CTU3D node, the quad-tree of CU3Ds can be scanned and processed using a depth first quad-tree scan order. Child nodes under same parent node are scanned and processed using raster scan order at either horizontal direction or vertical direction.

In some embodiments, for CU3D at a given quad-tree depth, the max_cu3d_height/max_cu3d_width of the CU3Ds can be calculated using (Eq. 1) and (Eq. 2), and the maximum recursive depth is reached when both max_cu3d_height and max_cu3d_width are smaller than or equals to a predefined threshold. This predefined threshold can either be included in the bitstream explicitly or can be a predefined number (such as 8) that can be inferred by decoder implicitly.

$$\text{max\_cu3d\_height} = \text{max\_ctu3d\_height} >> \text{depth} \quad \text{(Eq. 1)}$$

$$\text{max\_cu3d\_width} = \text{max\_ctu3d\_width} >> \text{depth} \quad \text{(Eq. 2)}$$

In some examples, a square shape partition is used so that max_ctu3d_height=max_ctu3d_width. for CU3D at a given quad-tree depth, the max_cu3d_size of these CU3Ds is calculated using (Eq. 3), and the maximum recursive depth is reached when max_cu3d_size is smaller than or equals to a predefined threshold. The threshold can either be included in bitstream explicitly or can be a predefined number (such as 8) that can be inferred by decoder implicitly.

$$\text{max\_cu3d\_size} = \text{max\_ctu3d\_size} >> \text{depth} \quad \text{(Eq. 3)}$$

Figure 9B:
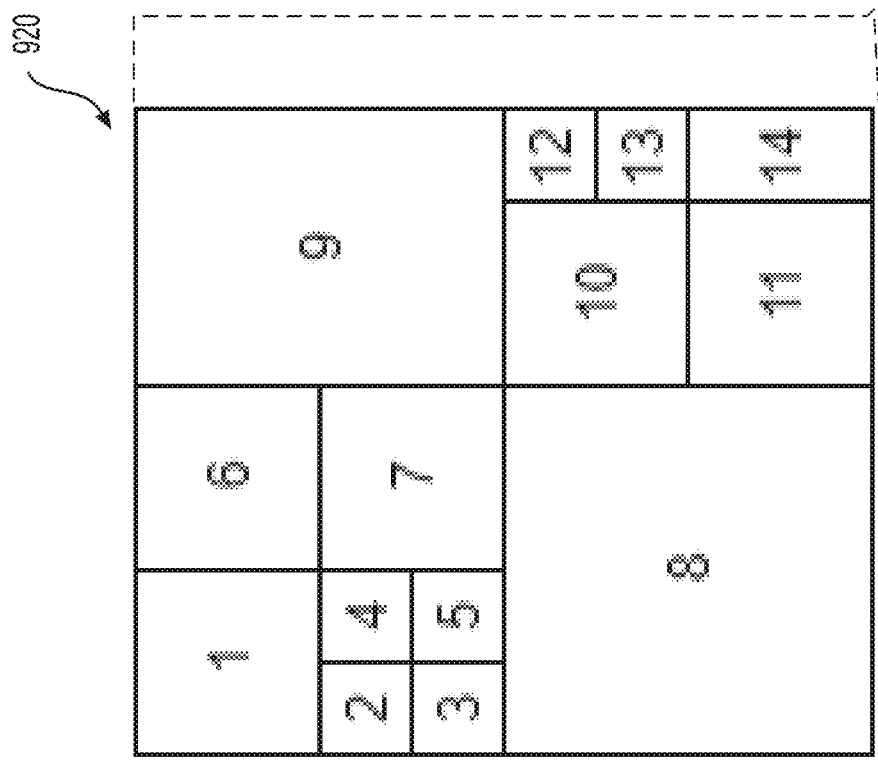
FIGS. 9A-9B show examples of partition and scan order according to some embodiments of the disclosure.
Figure 9A:
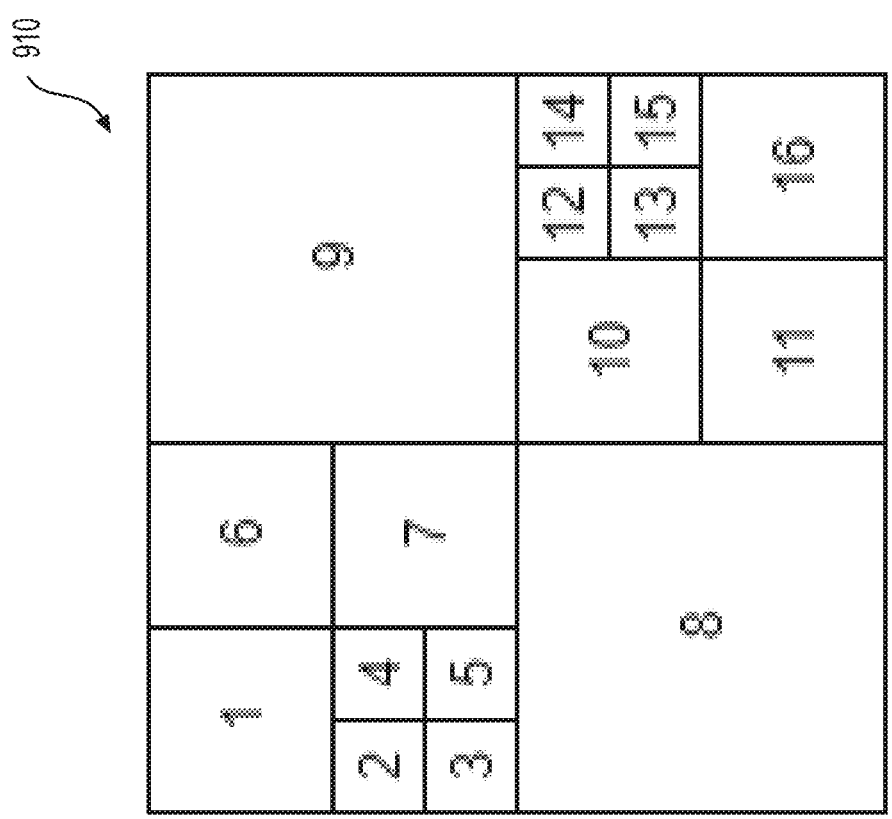

FIG. 9A shows an example of CTU3D partition and CU3D scan order according to some embodiments of the disclosure. In the FIG. 9A example, a CTU3D (910) has a square shape in the [C][K] plane and is partitioned om the [C][K] plane into 16 CU3Ds block-1 to block-16 as shown. Block-8 and block-9 have quad-tree depth 1; block-1, block-6, block-7, block-10, block-11 and block-16 have quad-tree depth 2; block-2 to block-5 and block-12 to block-15 have quad-tree depth 3. When the CU3Ds are scanned using raster scan at vertical direction, the CU3Ds are scanned in the order to block-1, block-2, block-3, block-4, block-5, block-6, block-7, block-8, block-9, block-10, block-11, block-12, block-13, block-14, block-15, and block-16.

FIG. 9B shows an example of CTU3D partition and CU3D scan order according to some embodiments of the disclosure. In the FIG. 9B example, a CTU3D (920) can be an edge CTU at the right of a tensor. In some example, the CTU3D (920) is partitioned into 14 CU3Ds block-1 to block-14 as shown. Block-8 and block-9 have quad-tree depth 1; block-1, block-6, block-7, block-10, block-11 and block-14 have quad-tree depth 2; block-2 to block-5 and block-12 to block-13 have quad-tree depth 3. When the CU3Ds are scanned using raster scan at vertical direction, the CU3Ds are scanned in the order to block-1, block-2, block-3, block-4, block-5, block-6, block-7, block-8, block-9, block-10, block-11, block-12, block-13, and block-14.

As shown by FIG. 9B, for CTU3D locates at the right and/or bottom of the tensor, the parent CU3D node at a given depth may not have all 4 child nodes. For CU3D locates at the right and/or bottom of the tensor, cu3d_height can be the remainder of max_ctu3d_height/max_cu3d_height and the cu3d_width can be the remainder of max_ctu3d_width/max_cu3d_width.

According to an aspect of the disclosure, a rate-distortion (RD) based encoding algorithm can be used to decide whether a parent CU3D needs to be split into multiple smaller child CU3Ds. In an example, the parent CU3D is split into multiple smaller child CU3Ds when the combined RD of the smaller child CU3Ds are smaller than the RD of the parent CU3D; otherwise parent CU3D does not need to be split. In some embodiments, split flags can be used to record splitting decisions at the encoder, and can be included in the bitstrem to inform the splitting decisions to decoder.

FIG. 10A and FIG. 10B show exemplary syntax tables for splitting CTU3D into CU3Ds according to some embodiments of the disclosure. For a CU3D, quad-tree depth is compared with a threshold (ctu3d_depth), when the quad-tree depth satisfies a condition (e.g., depth<ctu3d_depth-1), a flag (split_flag) is retrieved from the bitstream. The flag is used to indicate if the CU3D is a parent CU3D that is split into 4 smaller child CU3Ds. For example, when split_flag is 1, the CU3D is split into four smaller CU3Ds.

Aspects of the disclosure provide techniques to use syntax at various levels to ensure proper encoding and decoding of neural network models. In some examples, the syntax elements that describe the structure of the bitstream or provide information that applies to multiple layers, multiple blocks (e.g., multiple coding units, multiple CTU3Ds, multiple CU3Ds, and the like) are referred to as high level syntax.

According to an aspect of the disclosure, an NNR header size parameter nnr_header_size can be defined and included in the NNR header. The nnr_header size can be used to ensure random access of encoded layer(s). It is noted that nnr_header_size can be placed anywhere in the NNR header. In some examples, nnr_header_size is the first syntax element in the NNR header.

In some embodiments, the NNR header can include global bit depth information, for example, using the parameters max_ndim_bitdepth and max_1dim bitdepth. The parameter max_ndim_bitdepth is defined as max quantization bit depth among layers that are not 1 dimension (1D) array; and the parameter max_1dim_bitdepth is defined as max quantization bit depth of layers that are 1D array. The parameters max_ndim_bitdepth and max_1dim_bitdepth are used to guide decoder to perform appropriate memory allocation for decoded quantized layers.

FIG. 11 shows an exemplary syntax table for NNR header according to an embodiment of the disclosure. The NNR header includes syntax elements.

Specifically, in the FIG. 11 example, the syntax element nnr_header_size can be a parameter that carries the information of a total byte count of nnr_header including nnr_header_size itself. The syntax element total_layer can be the parameter that carries the information of the number of total layers in the NNR. The syntax element enable_zdep_reorder is a flag used to indicate whether a reorder algorithm (zdep reorder algorithm) is enabled or not. For example, when enable_zdep_reorder is equal to 0, the reorder algorithm is not allowed; and when enable_zdep_reorder is equal to 1, the reorder algorithm is allowed. The syntax element enable_max_ctu3d_size is a flag used to indicate whether sizes of CTU3D can be changed based on kernel size. For example, when enable_max_ctu3d_size is equal to 0, the CTU3D size parameters, such as ctu3d_height, ctu3d_width and the like are kept unchanged regardless of the kernel size; and when enable_max_ctu3d_size is equal to 1, the CTU3D size parameters, such as ctu3d_height, ctu3d_width and the like can be scaled based on the kernel size. The syntax element max_ctu3d_idx can be the parameter that carries the information of the CTU3D size. In an example, the CTU3D size parameter max_ctu3d_size can be determined based on (Eq. 4):

$$max\_ctu\_3d\_size=(max\_ctu3d\_idx==0)?64: \\ (max\_ctu3d\_idx==1)?32:(max\_ctu3d\_ \\ idx==2)?16:8 \quad (Eq.\ 4)$$

Thus, when max_ctu3d_idx is equal to 0, max_ctu_3d_size can be set to 64; when max_ctu3d_idx is equal to 1, max_ctu_3d_size can be set to 32; when max_ctu3d_idx is equal to 2, max_ctu_3d_size can be set to 16; and when max_ctu3d_idx is not any of 0, 1 and 2, max_ctu_3d_size can be set to 8.

Further, the syntax element max_ndim_bitdepth can be a parameter (global parameter) that carries the information of the max quantization bit depth among layers that are not 1 dimension (1D) array. The syntax element max_1dim_bitdepth can be the parameter (global parameter) that carries the information of max quantization bit depth of layers that are 1D array.

According to an aspect of the disclosure, the layer header can include information of the current layer and sublayers of the current layer.

FIG. 12 shows an exemplary syntax table for layer header according to an embodiment of the disclosure. The layer header includes various syntax elements.

Specifically, the syntax element layer_size is a parameter that is used to carry the information of the total byte count of encoded layer including layer_size itself. The layer size parameter layer_size can be defined and included in the layer header to ensure random access of encoded layer(s). The layer size parameter can be placed anywhere (outside of the sublayer loop) in the layer header. In some examples, the layer size parameter layer_size is the first syntax element in the layer header.

In some embodiments, a layer can include sublayers, such as bias sublayer, a batch normalization sublayer and the like. Information of the sublayers can be included in the layer header. The syntax element total_sublayer is a parameter that is used to carry the information of the number of sublayers. The syntax element sublayer_size is a parameter that is used to carry the information of the total byte count of encoded sublayer. In some examples, the sublayer size parameter sublayer_size can be defined and included in the layer header to ensure random access of encoded sublayer.

The syntax element sublayer_ndim is a parameter that is used to carry the information of the number of dimensions of the current sublayer. The syntax element sublayer_shape[ ] is a parameter that is sued to carry the information of the shape of the current sublayer. In an embodiment, sublayer parameters, such as sublayer_ndim and sublayer_shape[ndim] and the like, are included in layer header. In another embodiment, sublayer parameters, such as sublayer_ndim and sublayer_shape[ndim] and the like, are not included in layer header. In such case, the decoder can rely on the external model structure to obtain values of the parameters.

The syntax element sublayer_scan_order is a flag that is used to indicate CTU3D/CU3D scan order. For example, when sublayer_scan_order is equal to 0, raster scan order at horizontal direction can be used for CTU3D scan order and/or CU3D scan order; and when sublayer_scan_order is equal to 1, raster scan order at vertical direction can be used for CTU3D scan order and/or CU3D scan order.

The syntax element sublayer_sat_maxw is a parameter that carries the saturated max value of multi-dimension tensor in the layer. The saturated max value can be either integer or float format.

The syntax element sublayer_delta_bitdepth is used to carry a bit depth difference of the sublayer to the global bit depth (e.g., max_1dim_bitdepth or max_ndim_bitdepth in the NNR header). In an example, the bit depth of the sublayer can be calculated using (Eq. 5)

$$\text{sublayer bitdepth} = ((\text{ndim} == 1)?\ \text{max\_1dim\_bitdepth}: \text{max\_ndim\_bitdepth}) - \text{sublayer\_delta\_bitdepth} \quad (\text{Eq. 5})$$

In an embodiment, all sublayers that are 1D can share the same bit depth (e.g., having the same max_1dim_bitdepth), thus sublayer_delta_bitdepth is not needed in layer header. In another embodiment, each sublayer with 1D can have its own bit depth, thus sublayer_delta_bitdepth can be included in layer header.

According to an aspect of the disclosure, a layer can include multiple sublayer. In an example, a layer can include a convolution sublayer and a bias sublayer. In another example, a layer can include a fully connected sublayer and a bias sublayer. In some embodiments, when a layer includes a bias sublayer and another sublayer, the bias sublayer is coded (encoded/decoded) in the bitstream before the other sublayer. For example, when a layer includes a convolution sublayer and a bias sublayer, the bias sublayer is encoded and decoded before the convolution sublayer. In another example, when a layer includes a fully connected sublayer and a bias sublayer, the bias sublayer is coded (encoded and decoded) in the bitstream before the fully connected sublayer.

FIG. 13 shows an exemplary syntax according to an embodiment of the disclosure. As shown by (1310), when the layer includes a bias sublayer and another sublayer, such as convolution sublayer (e.g., type is conv), fully connected sublayer (e.g., type is fc), the bias sublayer is coded in the bitstream before the other sublayer.

Figure 14:
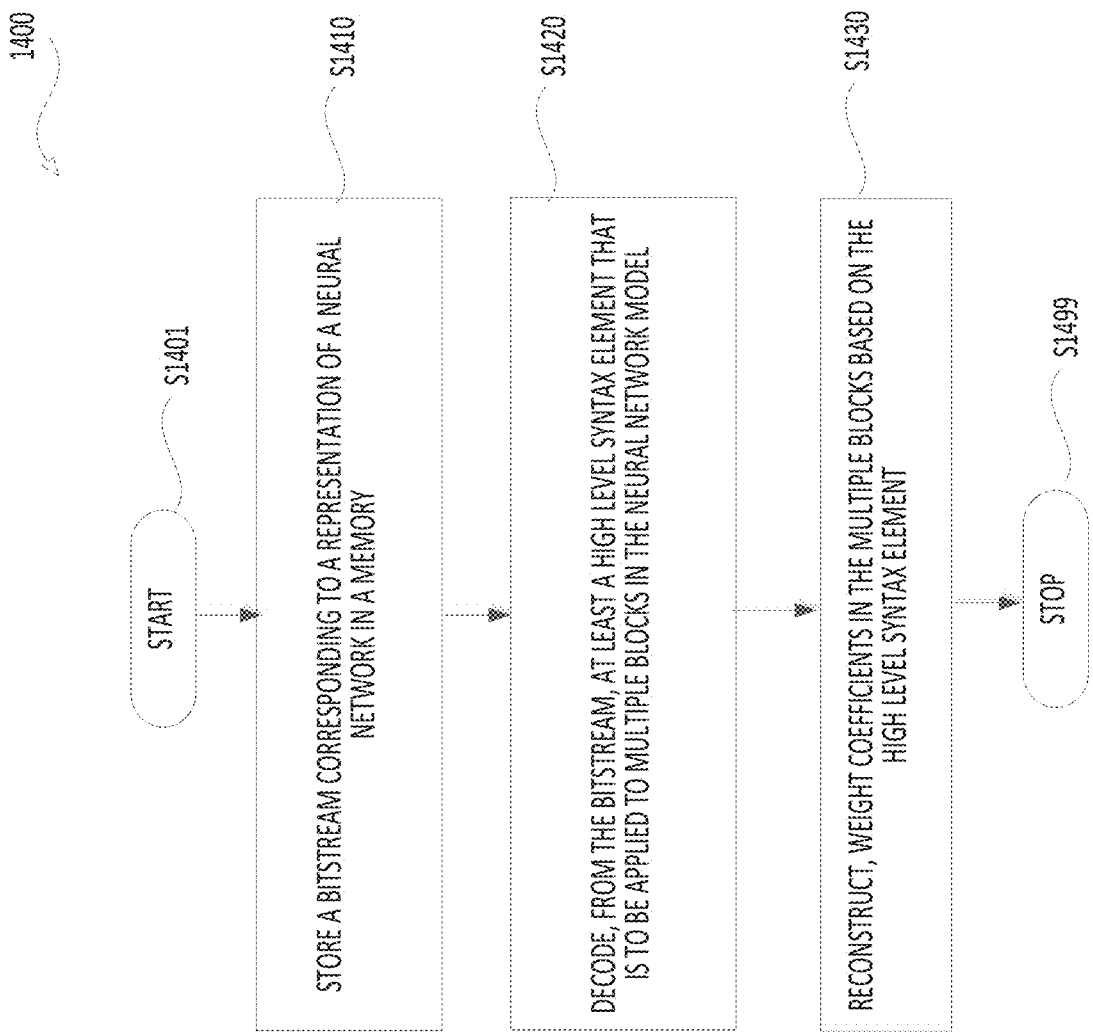
FIG. 14 shows a flow chart outlining a process example according to some embodiments of the disclosure.

FIG. 14 shows a flow chart outlining a process (1400) according to an embodiment of the disclosure. The process (1400) can be used in a device, such as the electronic device 130 to decode (decompress) a bistream corresponding to a representation of a neural network. The process starts at (S1401) and proceeds to (S1410).

At (S1410), a bitstream corresponding to a representation of a neural network is stored in a memory. For example, the main memory 160 stores a compressed neural network model that is a representation of a neural network. In some embodiments, the compressed neural network model is transmitted from the application server 110 to the electronic device 130. When the electronic device 130 receives the compressed neural network model, the electronic device 130 stores the compressed neural network model in the main memory 160.

At (S1420), a syntax element to be applied to multiple blocks in the neural network is decoded from the bitstream.

At (S1430), weight coefficients of the multiple blocks are decoded based on the syntax element.

In some examples, the syntax element is in the NNR header. In an example, from the NNR header, an index (e.g., max_ctu3d_idx) that is indicative of a CTU size (e.g., CTU3D size) is decoded. Then, a weight tensor can be partitioned into CTUs based on the CTU size that is indicated by the index. Then, the weigh coefficients of the CTUs can be reconstructed from the bitstream.

In an example, from the NNR header, a flag (e.g., enable_max_ctu3d_size) that indicates whether to change the CTU size based on a kernel size is decoded. In response to an enable of changing the CTU size based on the kernel size that is indicated by the flag, the CTU size is updated based on the kernel size. Further, a weight tensor can be partitioned into CTUs based on the updated CTU size. Then, weigh coefficients of the CTUs can be reconstructed from the bitstream.

In some embodiments, from the bitstream, one or more split flags that are indicative of partitions in a CTU can be decoded. The CTU is then partitioned into CUs (e.g., CU3D) based on the one or more split flags.

In some embodiments, based on at least the syntax element (e.g., max_ndim_bitdepth, max_1dim_bitdepth, layer_bitdepth and the like), a bit depth for quantized weight coefficients in a layer can be determined. Then, a memory space for the quantized weight coefficients cam be allocated based on the bit depth. Thus, the quantized weigh coefficients in the layer can be decoded from the bistream using the allocated memory space. In some example, from the NNR header, a global bit depth (e.g., max_ndim_bitdepth, max_1dim_bitdepth, and the like) can be decoded. Then, from a layer header for the layer, a difference (e.g., sublayer_delta_bitdepth) of the bit depth from the global bit depth can be decoded. The bit depth for quantized weigh coefficients in the layer can be determined based on a combination of the global bit depth and the difference of the bit depth from the global bit depth.

In some examples, from a layer header, a flag (e.g., sublayer_scan_order) indicative of a scan order of the multiple blocks in a layer can be decoded. Then, the multiple blocks can be decoded from the bitstream according to the scan order. Additionally, in some example, from a layer header, at least one of a number of dimensions in a layer (e.g., sublayer_ndim), a shape of the layer (e.g., sublayer_shape[ ]), a saturated maximum value (e.g., layer_sat_maxw) in the layer, and a quantization step size (e.g., layer_stepsize) in the layer can be decoded from the layer header.

In some embodiments, when a layer includes a bias sublayer and another sublayer, the bias sublayer is coded before the other sublayer in the bitstream.

In some embodiments, a parameter that is indicative of a total size of a header portion in the bitstream can be decoded from the header portion in the bitstream. The parameter can be used to access (referred to as random access) a portion behind the header portion in the bitstream based on the parameter.

The techniques described above, can be implemented as computer software using computer-readable instructions and physically stored in one or more computer-readable media. For example, FIG. 15 shows a computer system (1500) suitable for implementing certain embodiments of the disclosed subject matter.

The computer software can be coded using any suitable machine code or computer language, that may be subject to assembly, compilation, linking, or like mechanisms to create code comprising instructions that can be executed directly, or through interpretation, micro-code execution, and the like, by one or more computer central processing units (CPUs), Graphics Processing Units (GPUs), and the like.

The instructions can be executed on various types of computers or components thereof, including, for example, personal computers, tablet computers, servers, smartphones, gaming devices, internet of things devices, and the like.

Figure 15:
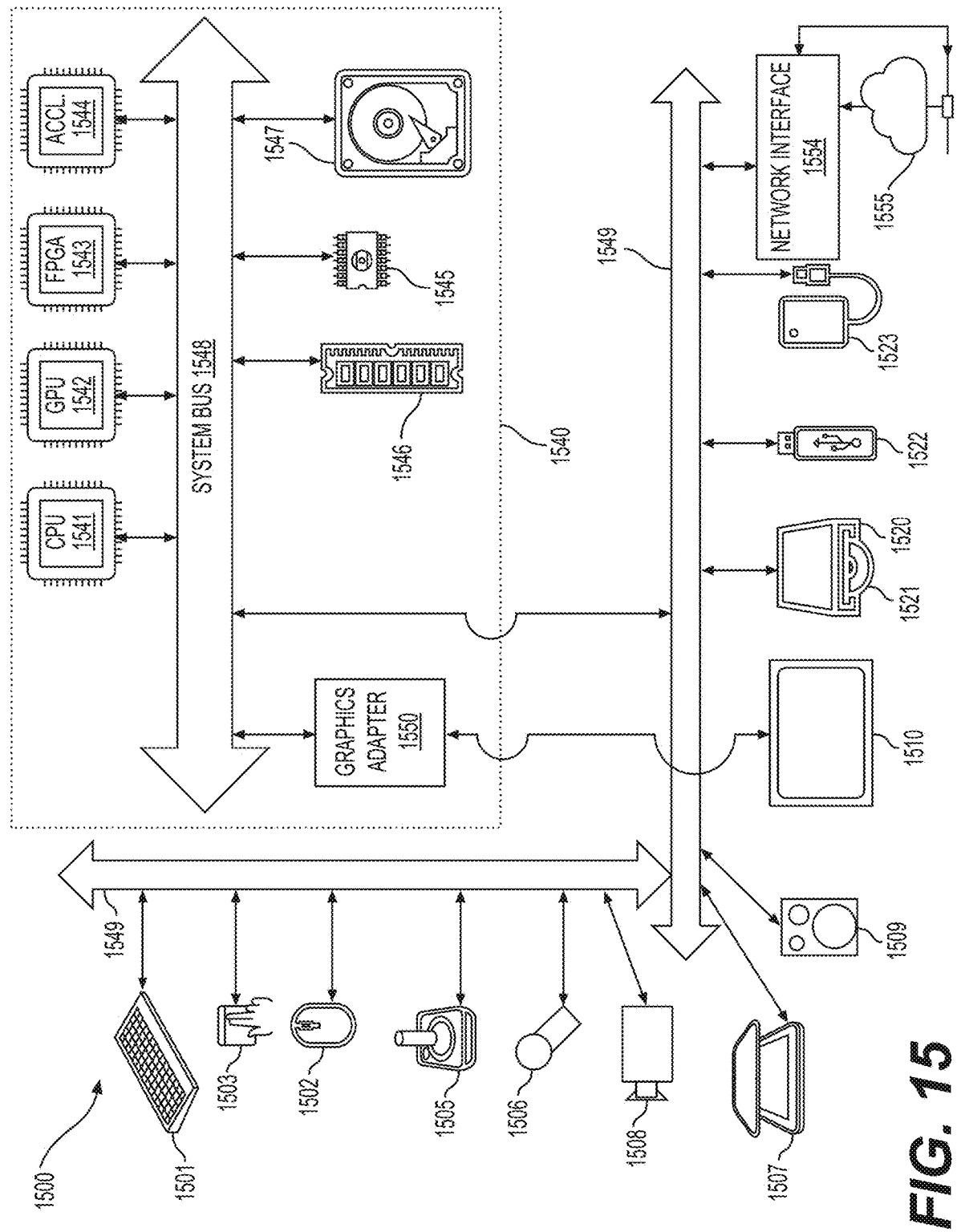
FIG. 15 is a schematic illustration of a computer system in accordance with an embodiment.

The components shown in FIG. 15 for computer system (1500) are exemplary in nature and are not intended to suggest any limitation as to the scope of use or functionality of the computer software implementing embodiments of the present disclosure. Neither should the configuration of components be interpreted as having any dependency or requirement relating to any one or combination of components illustrated in the exemplary embodiment of a computer system (1500).

Computer system (1500) may include certain human interface input devices. Such a human interface input device may be responsive to input by one or more human users through, for example, tactile input (such as: keystrokes, swipes, data glove movements), audio input (such as: voice, clapping), visual input (such as: gestures), olfactory input (not depicted). The human interface devices can also be used to capture certain media not necessarily directly related to conscious input by a human, such as audio (such as: speech, music, ambient sound), images (such as: scanned images, photographic images obtain from a still image camera), video (such as two-dimensional video, three-dimensional video including stereoscopic video).

Input human interface devices may include one or more of (only one of each depicted): keyboard (1501), mouse (1502), trackpad (1503), touch screen (1510), data-glove (not shown), joystick (1505), microphone (1506), scanner (1507), camera (1508).

Computer system (1500) may also include certain human interface output devices. Such human interface output devices may be stimulating the senses of one or more human users through, for example, tactile output, sound, light, and smell/taste. Such human interface output devices may include tactile output devices (for example tactile feedback by the touch-screen (1510), data-glove (not shown), or joystick (1505), but there can also be tactile feedback devices that do not serve as input devices), audio output devices (such as: speakers (1509), headphones (not depicted)), visual output devices (such as screens (1510) to include CRT screens, LCD screens, plasma screens, OLED screens, each with or without touch-screen input capability, each with or without tactile feedback capability—some of which may be capable to output two dimensional visual output or more than three dimensional output through means such as stereographic output; virtual-reality glasses (not depicted), holographic displays and smoke tanks (not depicted)), and printers (not depicted).

Computer system (1500) can also include human accessible storage devices and their associated media such as optical media including CD/DVD ROM/RW (1520) with CD/DVD or the like media (1521), thumb-drive (1522), removable hard drive or solid state drive (1523), legacy magnetic media such as tape and floppy disc (not depicted), specialized ROM/ASIC/PLD based devices such as security dongles (not depicted), and the like.

Those skilled in the art should also understand that term "computer readable media" as used in connection with the presently disclosed subject matter does not encompass transmission media, carrier waves, or other transitory signals.

Computer system (1500) can also include an interface to one or more communication networks. Networks can for example be wireless, wireline, optical. Networks can further be local, wide-area, metropolitan, vehicular and industrial, real-time, delay-tolerant, and so on. Examples of networks include local area networks such as Ethernet, wireless LANs, cellular networks to include GSM, 3G, 4G, 5G, LTE and the like, TV wireline or wireless wide area digital networks to include cable TV, satellite TV, and terrestrial broadcast TV, vehicular and industrial to include CANBus, and so forth. Certain networks commonly require external network interface adapters that attached to certain general purpose data ports or peripheral buses (1549) (such as, for example USB ports of the computer system (1500)); others are commonly integrated into the core of the computer system (1500) by attachment to a system bus as described below (for example Ethernet interface into a PC computer system or cellular network interface into a smartphone computer system). Using any of these networks, computer system (1500) can communicate with other entities. Such communication can be uni-directional, receive only (for example, broadcast TV), uni-directional send-only (for example CANbus to certain CANbus devices), or bi-directional, for example to other computer systems using local or wide area digital networks. Certain protocols and protocol stacks can be used on each of those networks and network interfaces as described above.

Aforementioned human interface devices, human-accessible storage devices, and network interfaces can be attached to a core (1540) of the computer system (1500).

The core (1540) can include one or more Central Processing Units (CPU) (1541), Graphics Processing Units (GPU) (1542), specialized programmable processing units in the form of Field Programmable Gate Areas (FPGA) (1543), hardware accelerators for certain tasks (1544), and so forth. These devices, along with Read-only memory (ROM) (1545), Random-access memory (1546), internal mass storage such as internal non-user accessible hard drives, SSDs, and the like (1547), may be connected through a system bus (1548). In some computer systems, the system bus (1548) can be accessible in the form of one or more physical plugs to enable extensions by additional CPUs, GPU, and the like. The peripheral devices can be attached either directly to the core's system bus (1548), or through a peripheral bus (1549). Architectures for a peripheral bus include PCI, USB, and the like.

CPUs (1541), GPUs (1542), FPGAs (1543), and accelerators (1544) can execute certain instructions that, in combination, can make up the aforementioned computer code. That computer code can be stored in ROM (1545) or RAM (1546). Transitional data can be also be stored in RAM (1546), whereas permanent data can be stored for example, in the internal mass storage (1547). Fast storage and retrieve to any of the memory devices can be enabled through the use of cache memory, that can be closely associated with one or more CPU (1541), GPU (1542), mass storage (1547), ROM (1545), RAM (1546), and the like.

The computer readable media can have computer code thereon for performing various computer-implemented operations. The media and computer code can be those specially designed and constructed for the purposes of the present disclosure, or they can be of the kind well known and available to those having skill in the computer software arts.

As an example and not by way of limitation, the computer system having architecture (1500), and specifically the core (1540) can provide functionality as a result of processor(s) (including CPUs, GPUs, FPGA, accelerators, and the like) executing software embodied in one or more tangible, computer-readable media. Such computer-readable media can be media associated with user-accessible mass storage as introduced above, as well as certain storage of the core (1540) that are of non-transitory nature, such as core-internal mass storage (1547) or ROM (1545). The software implementing various embodiments of the present disclosure can be stored in such devices and executed by core (1540). A computer-readable medium can include one or more memory devices or chips, according to particular needs. The software can cause the core (1540) and specifically the processors therein (including CPU, GPU, FPGA, and the like) to execute particular processes or particular parts of particular processes described herein, including defining data structures stored in RAM (1546) and modifying such data structures according to the processes defined by the software. In addition or as an alternative, the computer system can provide functionality as a result of logic hardwired or otherwise embodied in a circuit (for example: accelerator (1544)), which can operate in place of or together with software to execute particular processes or particular parts of particular processes described herein. Reference to software can encompass logic, and vice versa, where appropriate. Reference to a computer-readable media can encompass a circuit (such as an integrated circuit (IC)) storing software for execution, a circuit embodying logic for execution, or both, where appropriate. The present disclosure encompasses any suitable combination of hardware and software.

While this disclosure has described several exemplary embodiments, there are alterations, permutations, and various substitute equivalents, which fall within the scope of the disclosure. It will thus be appreciated that those skilled in the art will be able to devise numerous systems and methods which, although not explicitly shown or described herein, embody the principles of the disclosure and are thus within the spirit and scope thereof.

What is claimed is:

1. A method for neural network decoding in a decoder, comprising:
    decoding, from a neural network representation (NNR) header of a bitstream, an index that is indicative of a coding tree unit (CTU) size associated with the neural network;
    partitioning a weight tensor associated with a layer of the neural network into CTUs based on the CTU size that is indicated by the index, each of the CTUs including one or multiple blocks in the layer of the neural network;
    decoding, by a processor and from the bitstream, at least a syntax element to be applied to the multiple blocks in the layer of the neural network; and
    reconstructing, by the processor and from the bitstream, weight coefficients of the multiple blocks based on the syntax element.

2. The method of claim 1, further comprising:
    decoding, from the NNR header, a flag that indicates whether to change the CTU size based on a kernel size;
    updating the CTU size based on the kernel size in response to changing the CTU size based on the kernel size being indicated as enabled by the flag;
    partitioning the weight tensor into the CTUs based on the updated CTU size; and
    reconstructing, from the bitstream, the weight coefficients of the CTUs.

3. The method of claim 1, further comprising:
    decoding, from the bitstream, one or more split flags indicative of partitions in a CTU of the CTUs; and
    partitioning the CTU into coding units (CUs) based on the one or more split flags.

4. The method of claim 1, further comprising:
    determining, based on at least the syntax element, a bit depth for quantized weight coefficients in the layer;
    allocating a memory space for the quantized weight coefficients based on the bit depth; and
    decoding, from the bitstream, the quantized weight coefficients in the layer using the allocated memory space.

5. The method of claim 4, further comprising:
    decoding, from the NNR header, a global bit depth;
    decoding, from a layer header for the layer, a difference of the bit depth from the global bit depth; and
    determining the bit depth for the quantized weight coefficients in the layer based on a combination of the global bit depth and the difference of the bit depth from the global bit depth.

6. The method of claim 1, further comprising:
    decoding, from a layer header, a flag indicative of a scan order of the multiple blocks in the layer; and
    decoding the multiple blocks from the bitstream according to the scan order.

7. The method of claim 1, further comprising:
    decoding, from a layer header, at least one of a number of dimensions in the layer, a shape of the layer, a scan order of coding units in the layer, a saturated maximum value in the layer, or a quantization step size in the layer.

8. The method of claim 1, further comprising:
    decoding, from the bitstream, a bias sublayer of the layer before decoding another sublayer of the layer in response to the layer including the bias sublayer and the other sublayer.

9. The method of claim 1, further comprising:
    decoding a parameter from a header portion in the bitstream, the parameter being indicative of a total size of the header portion; and
    accessing a portion behind the header portion in the bitstream based on the parameter.

10. The method of claim 1, wherein the reconstructing the weight coefficients further comprises:
    decoding quantized weight coefficients in the layer; and
    reconstructing the weight coefficients based on the decoded quantized weight coefficients and a step size indicated by the decoded syntax element.

11. An apparatus for neural network decoding, comprising:
    processing circuitry configured to:
        decode, from a neural network representation (NNR) header of a bitstream, an index that is indicative of a coding tree unit (CTU) size associated with the neural network;
        partition a weight tensor associated with a layer of the neural network into CTUs based on the CTU size that is indicated by the index, each of the CTUs including one or multiple blocks in the layer of the neural network;
        decode, by a processor and from the bitstream, at least a syntax element to be applied to the multiple blocks in the layer of the neural network; and
        reconstruct, by the processor and from the bitstream, weight coefficients of the multiple blocks based on the syntax element.

12. The apparatus of claim 11, wherein the processing circuitry is configured to:
    decode, from the NNR header, a flag that indicates whether to change the CTU size based on a kernel size;
    update the CTU size based on the kernel size in response to changing the CTU size based on the kernel size being indicated as enabled by the flag;
    partition the weight tensor into the CTUs based on the updated CTU size; and reconstruct, from the bitstream, the weight coefficients of the CTUs.

13. The apparatus of claim 11, wherein the processing circuitry is configured to:
decode, from the bitstream, one or more split flags indicative of partitions in a CTU of the CTUs; and
partition the CTU into coding units (CUs) based on the one or more split flags.

14. The apparatus of claim 11, wherein the processing circuitry is configured to:
determine, based on at least the syntax element, a bit depth for quantized weight coefficients in the layer;
allocate a memory space for the quantized weight coefficients based on the bit depth; and
decode, from the bitstream, the quantized weight coefficients in the layer using the allocated memory space.

15. The apparatus of claim 14, wherein the processing circuitry is configured to:
decode, from the NNR header, a global bit depth;
decode, from a layer header for the layer, a difference of the bit depth from the global bit depth; and
determine the bit depth for the quantized weight coefficients in the layer based on a combination of the global bit depth and the difference of the bit depth from the global bit depth.

16. The apparatus of claim 11, wherein the processing circuitry is configured to:
decode, from a layer header, a flag indicative of a scan order of the multiple blocks in the layer; and
decode the multiple blocks from the bitstream according to the scan order.

17. The apparatus of claim 11, wherein the processing circuitry is configured to:
decode, from a layer header, at least one of a number of dimensions in the layer, a shape of the layer, a scan order of coding units in the layer, a saturated maximum value in the layer, or a quantization step size in the layer.

18. The apparatus of claim 11, wherein the processing circuitry is configured to:
decode, from the bitstream, a bias sublayer of the layer before decoding another sublayer of the layer in response to the layer including the bias sublayer and the other sublayer.

19. The apparatus of claim 11, wherein the processing circuitry is configured to:
decode a parameter from a header portion in the bitstream, the parameter being indicative of a total size of the header portion; and
access a portion behind the header portion in the bitstream based on the parameter.

20. The apparatus of claim 11, wherein the processing circuitry is configured to:
decode quantized weight coefficient in the layer; and
reconstruct the weight coefficients based on the quantized weight coefficient that is decoded and a step size indicated by the decoded at least the syntax element.

* * * * *